US010762977B1

(12) United States Patent
Chang et al.

(10) Patent No.: US 10,762,977 B1
(45) Date of Patent: Sep. 1, 2020

(54) MEMORY STORAGE DEVICE AND MEMORY TESTING METHOD THEREOF

(71) Applicant: Winbond Electronics Corp., Taichung (TW)

(72) Inventors: Kuen-Huei Chang, Taipei (TW); Che-Min Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/518,937

(22) Filed: Jul. 22, 2019

(51) Int. Cl.
*G11C 7/00* (2006.01)
*G11C 29/00* (2006.01)
*G11C 29/18* (2006.01)
*G11C 7/10* (2006.01)
*G06F 3/06* (2006.01)

(52) U.S. Cl.
CPC ............ *G11C 29/18* (2013.01); *G06F 3/0679* (2013.01); *G06F 3/0688* (2013.01); *G11C 7/1078* (2013.01)

(58) Field of Classification Search
CPC ..... G11C 29/18; G11C 7/1078; G06F 3/0679; G06F 3/0688
See application file for complete search history.

(56) References Cited

U.S. PATENT DOCUMENTS

| 2006/0265636 | A1 | 11/2006 | Hummler |
| 2010/0083065 | A1 | 4/2010 | Longwell et al. |
| 2010/0262889 | A1 | 10/2010 | Bains |
| 2014/0101378 | A1* | 4/2014 | Olbrich ............... G06F 13/1657 711/103 |
| 2019/0286372 | A1* | 9/2019 | Yang .................... G11C 7/1096 |
| 2020/0142773 | A1* | 5/2020 | Yoneda .................. G06F 11/10 |

FOREIGN PATENT DOCUMENTS

TW 200928718 7/2009

OTHER PUBLICATIONS

"Office Action of Taiwan Counterpart Application", dated Apr. 13, 2020, p. 1-7.

* cited by examiner

*Primary Examiner* — Toan K Le
(74) *Attorney, Agent, or Firm* — JCIPRNET

(57) ABSTRACT

A memory storage device and a memory testing method for testing a memory array of the memory storage device are provided. The memory testing method includes the following steps: writing first data into a plurality of first segments of the memory array, and writing second data to a second segment of the memory array; obtaining third data by reading the plurality of first segments, and obtaining fourth data by reading the second segment; converting the fourth data to fifth data, wherein the fifth data is the same as check data obtained by encoding the first data by using an encoding circuit corresponding to a decoding circuit of the memory storage device.

12 Claims, 3 Drawing Sheets

MEMORY STORAGE DEVICE AND MEMORY TESTING METHOD THEREOF

BACKGROUND

Technical Field

The invention relates to a memory testing technique and more particularly, to a memory storage device and a memory testing method thereof with error correction code (ECC) function.

Description of Related Art

Generally, when memory cells of a memory storage device, such as a dynamic random access memory (DRAM) or the like, are tested, multiple sets of test data (e.g., all-1 data, all-0 data, checkerboard data, inverse checkerboard data and so on) in a specific form are written into the memory cells to test whether any abnormal leakage current appears to a leakage path of each memory cell. Nevertheless, for a memory storage device with an error correction code (ECC) function, data in data bits and verification bits cannot be controlled to have a predetermined form simultaneously so that a test coverage is reduced and a testing time is extended.

SUMMARY

Accordingly, the embodiments of the disclosure provide a memory storage device and a memory testing method thereof capable of maintaining a preferable test coverage and saving a testing time.

According to an embodiment of the disclosure, a memory management method for testing a memory array of a memory storage device is provided. The memory testing method includes the following steps. First data is written into a plurality of first segments of the memory array, and second data is written into a second segment of the memory array. Third data is obtained by reading the plurality of first segments, and fourth data is obtained by reading the second segment. The fourth data is converted to fifth data, wherein the fifth data is the same as check data obtained by encoding the first data by using an encoding circuit corresponding to a decoding circuit of the memory storage device.

According to an embodiment of the disclosure, a memory device including a memory array and a memory controlling circuit is provided. The memory array includes a plurality of first segments and a second segment. The memory controlling circuit includes a data writing circuit, a data reading circuit, a decoding circuit and a data converting circuit. The data writing circuit is coupled to the memory array and configured to write first data into the plurality of first segments and write second data into the second segment. The data writing circuit is coupled to the memory array and configured to obtain third data by reading the plurality of first segments and obtain fourth data by reading the second segment. The decoding circuit is coupled to the data reading circuit. The data converting circuit is coupled between the data reading circuit and the decoding circuit and configured to convert the fourth data to fifth data, wherein the fifth data is the same as check data obtained by encoding the first data by using an encoding circuit corresponding to the decoding circuit.

To make the above features and advantages of the disclosure more comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
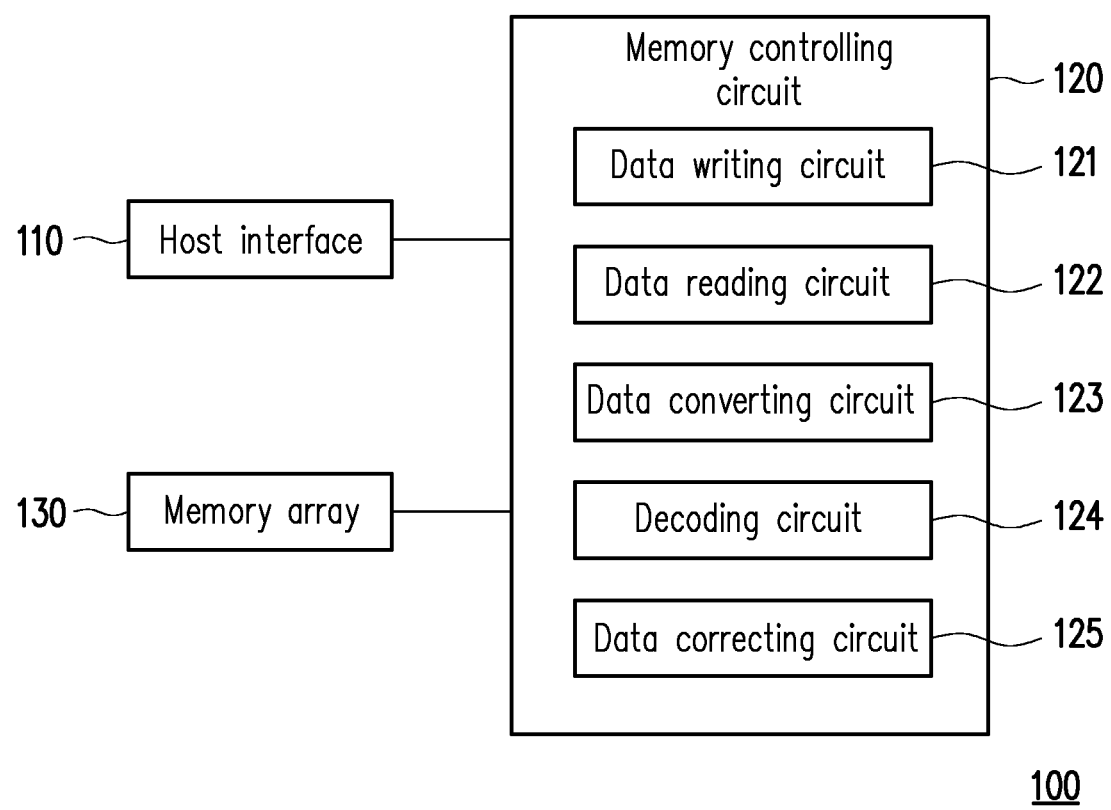
FIG. 1 is a block diagram illustrating a memory storage device according to an embodiment of the disclosure.

The preferred embodiments of the disclosure will be described in detail with reference to the accompanying drawings. The same or similar elements are represented by using the same reference labels as many as possible in the drawings and the specification.

Referring to FIG. 1, a memory storage device 100 includes a host interface 110, a memory controlling circuit 120 and a memory array 130. The memory storage device 100 may be, for example, a volatile memory used together with a host system (not shown), and the host system may write data into the memory storage device 100 or read the required data from the memory storage device 100. The memory storage device 100, for example, adopts an error correction code (ECC) scheme.

The host interface 110 is coupled to the host system and configured to communicate with the host system, for example, to receive write data from the host system or to return data read by the host system to the host system. Nevertheless, the disclosure is not intent to limit the host interface 110 to a specific type and an implementation manner herein.

The memory controlling circuit 120 is coupled to the host interface 110 and the memory array 130 and configured to execute a plurality of logic gates or control commands which are implemented in a hardware form or in a firmware form and perform operations, such as writing data, reading data or deleting data in the memory array 130 according to the commands of the host system.

The memory array 130 includes a plurality of memory cells, and each of the memory cells may be configured to store data having one or more bits.

Figure 2:
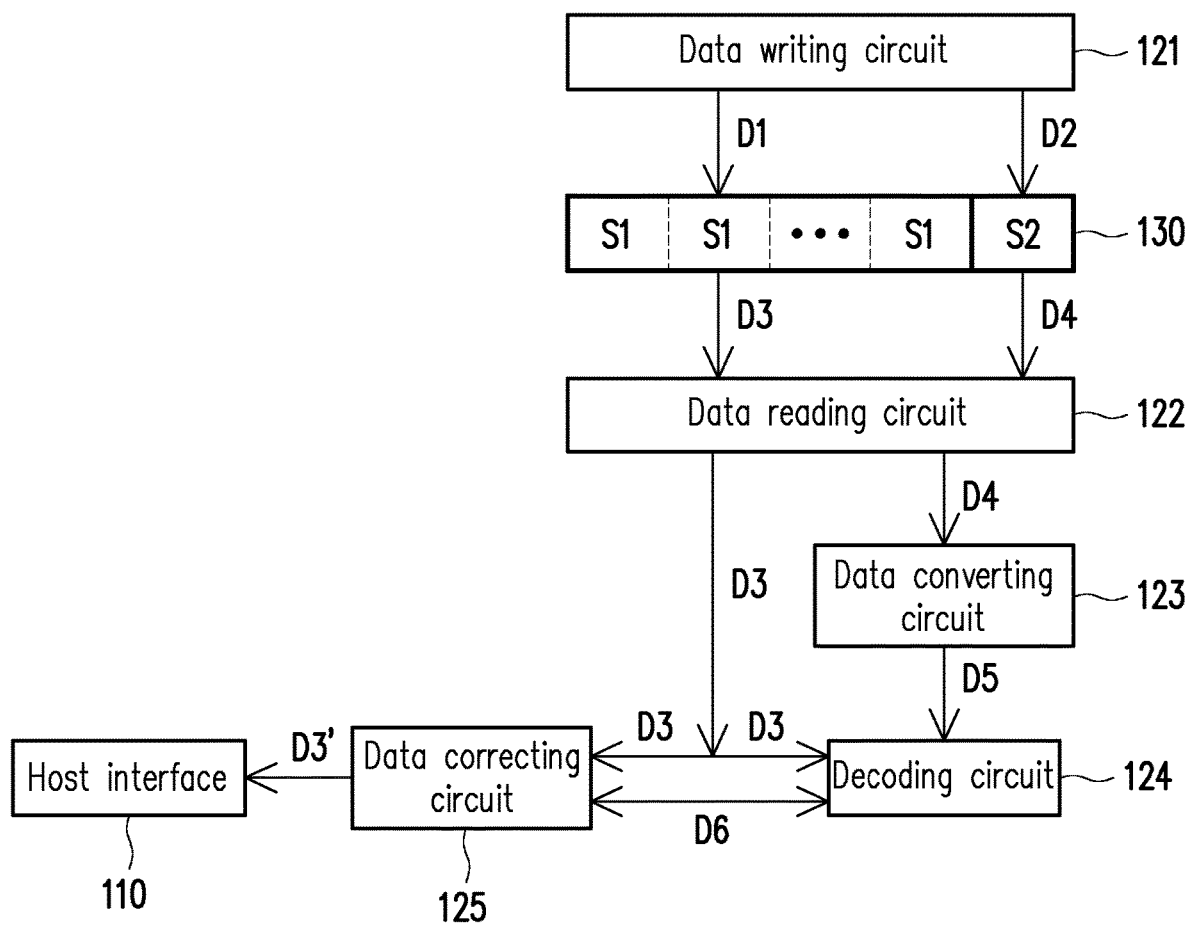
FIG. 2 is a schematic diagram illustrating a memory testing method according to an embodiment of the disclosure.

Referring to FIG. 2, a memory testing method of the present embodiment is applicable to the memory storage device 100 illustrated in FIG. 1 and thus, will be described in collaboration with the memory storage device 100 illustrated in FIG. 1 hereinafter. The memory controlling circuit 120 further includes a data writing circuit 121, a data reading circuit 122, a data converting circuit 123, a decoding circuit 124 and a data correcting circuit 125. The memory cells in the memory array 130 may be divided into a plurality of first segments S1 and a corresponding second segment S2.

In the present embodiment, the memory cells to be tested in the memory array 130 may be divided into, for example, 16 first segments S1 and one second segment S2, and each of the first segments S1 and the second segment S2 are, for example, respectively used to record data having 8 bits, but the disclosure is not limited thereto.

In the present embodiment, the decoding circuit 124 of the memory storage device 100 adopting the ECC scheme may be, for example, an ECC decoder, such that an encoding circuit corresponding to the decoding circuit 124 is an ECC encoder. In the present embodiment, this ECC encoder, after encoding all data (e.g., data composed of 16 repeated 8-bit data segments) in compliance with a preset type (which is, for example, composed of a plurality of repeated data segments), may obtain all-0 check data (e.g., check data having 8 bits). Nevertheless, the disclosure is not intent to limit the aforementioned ECC scheme adopted by the memory storage device 100 to a specific algorithm and an implementation manner. In addition, the memory storage device 100 may also adopt other ECC schemes in other embodiments, but the disclosure is not limited thereto.

The data writing circuit 121 is coupled to the host interface 110 and the memory array 130 and configured to write first data D1 into the plurality of first segments S1 and to write second data D2 into the second segment S2. Specially, since both writing the first data D1 and writing the second data D2 are not through the encoding circuit so that the contents of the first data D1 and the second data D2 are controllable. It is to be mentioned that the testing of the memory array 130 may have a high test coverage and save a testing time when both the first data D1 and the second data D2 are controllable.

In the present embodiment, the first data D1 is data having 128 bits and is composed of 16 sets of second data D2 having 8 bits (for example, composed by cascading), so that the first data D1 is data in compliance with the preset type. Nevertheless, the first data D1 and the second data D2 are not limited to have specific types by the disclosure herein and may be implemented by those ordinarily skilled in the art based on their demands.

In the present embodiment, the first data D1 is not through the encoding circuit corresponding to the decoding circuit 124 but written into the plurality of first segments S1 of the memory array 130 by the data writing circuit 121, and the second data D2 is not through the encoding circuit corresponding to the decoding circuit 124 but written into the second segment S2 of the memory array 130 by the data writing circuit 121.

The data reading circuit 122 is coupled to the data correcting circuit 125 and also coupled between the memory array 130 and the data converting circuit 123, and the data reading circuit 122 is configured to obtain third data D3 by reading the plurality of first segments S1 and obtain fourth data D4 by reading the second segment S2 and transmit the fourth data D4 to the data converting circuit 123.

The data converting circuit 123 is coupled between the data reading circuit 122 and the decoding circuit 124 and configured to convert the fourth data D4 to fifth data D5. Specifically, the fifth data D5 is converted by data converting circuit 123 to data which is the same as the check data obtained after the first data is encoded by using the encoding circuit corresponding to the decoding circuit 124. For example, the encoding circuit corresponding to the decoding circuit 124 may encode the first data D1 to obtain an encoding result, and the encoding result includes a first part and a second part, wherein the first part corresponds to the first data D1, and the second part corresponds to the check data. Specially, the content of the fifth data D5 output by the data converting circuit 123 is the same as the content of the check data.

It is to be mentioned that the disclosure is not intent to limit the data converting circuit 123 to a specific implementation manner, and those ordinarily skilled in the art may design the data converting circuit 123 according to the ECC scheme adopted by the memory storage device 100 and/or the content of the first data D1.

In the present embodiment, since the encoding circuit corresponding to the decoding circuit 124 is capable of obtaining all-0 check data after encoding arbitrary data in compliance with a preset type. Thus, the data converting circuit 123 may be, for example, designed as a circuit for performing an exclusive or (XOR) operation on input data and the second data D2. To be detailed, the encoding circuit corresponding to the decoding circuit 124 obtains all-0 check data (e.g., 8 bits) after encoding the first data D1 in compliance with a preset type, and thus, in a condition that the fourth data D4 is the same as the second data D2, the data converting circuit 123 also converts the input fourth data D4 to all-0 fifth data (e.g., 8 bits).

The decoding circuit 124 is coupled to the data reading circuit 122 and the data converting circuit 123 and configured to determine whether any error bit exists in the third data D3 and the fifth data D5 of the memory array 130 according to the third data D3 read from the plurality of first segments S1 and the fifth data D5 converted from the fourth data D4 read from the second segment S2, or whether any abnormal memory cell exists in the plurality of first segments S1 and the second segment S2 and generate sixth data D6 including error bit information. For example, the sixth data D6 may include information related to the bits having errors in the third data D3 and the fifth data D5, or information related to the memory cells in the plurality of first segments S1 and the second segment S2 that abnormality appears. In other words, according to the third data D3 and the fifth data D5, the decoding circuit 124 may inspect the memory array 130 to find out abnormal memory cells therein. For example, when the sixth data D6 indicates that no errors exist in the third data D3 and the fifth data D5, it represents that both the plurality of first segments S1 and the second segment S2 pass the inspection. On the contrary, when the sixth data D6 indicates that the third data D3 and the fifth data D5 include a certain error bit, it represents that the abnormality may likely appear to the corresponding memory cells in the plurality of first segments S1 and the second segment S2 of the memory array 130.

In the present embodiment, after receiving the third data D3 and the fifth data D5, the decoding circuit 124 may, for example, take the fifth data D5 as check data and accordingly perform an ECC operation, thereby finding out error bits in the third data D3 and the fifth data D5 and accordingly generate the sixth data D6, and these error bits may be considered as corresponding to the abnormal memory cells in the memory array 130. Thus, the memory testing method of the memory storage device 100 introduced in the present embodiment may find out the abnormal memory cells existing in the plurality of first segments S1 and the second segment S2 in the memory array 130.

The data correcting circuit 125 is coupled to the data reading circuit 122, the decoding circuit 124 and the host interface 110, and it is configured to correct the third data D3 according to the sixth data D6 and output the corrected third data D3' to the host system through the host interface 110. For example, the data correcting circuit 125 may acquire which bits are incorrect in the third data D3 according to the sixth data D6, obtain the corrected third data D3' by flipping the incorrect bits and then, output the corrected third data D3' to the host interface 110.

In the present embodiment, the data correcting circuit is, for example, an ECC corrector. The data correcting circuit 125, for example, flips the error bits in the third data D3 to obtain the corrected third data D3' and then output the corrected third data D3' to the host interface 110. Thus, the memory testing method of the memory storage device 100 introduced in the present embodiment is capable of not only finding out the abnormal memory cells existing in the plurality of first segments S1 and the second segment S2 in the memory array 130, but also keeping the error correction function for correcting the error data and returning it to the host system.

Figure 3:
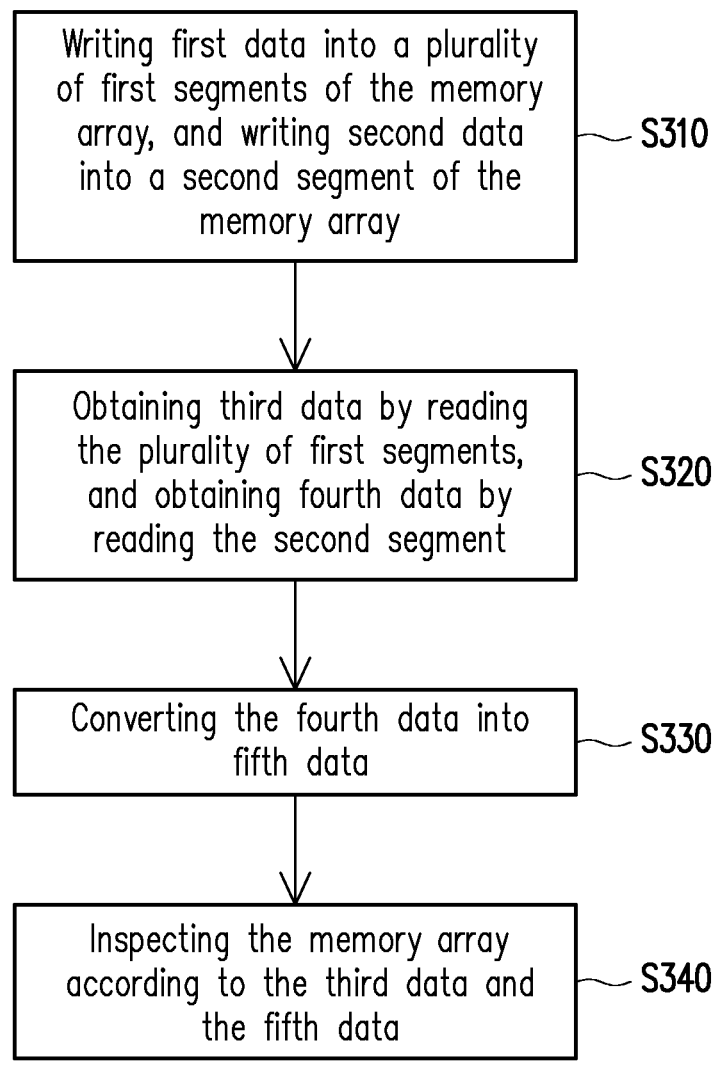
FIG. 3 is a flowchart illustrating a memory testing method according to an embodiment of the disclosure.

Referring to FIG. 3, a memory testing method of the present embodiment is applicable to the memory storage device 100 illustrated in FIG. 1 and FIG. 2 and thus, will be described in collaboration with the memory storage device 100 illustrated in FIG. 1 hereinafter. In addition, each step of the present embodiment has been described in detail as above, and the details will not repeated.

First, the data writing circuit 121 writes the first data D1 into the plurality of first segments S1 of the memory array 130 and writes the second data D2 into the second segment S2 of the memory array 130 (step S310). Then, the data reading circuit 122 obtains the third data D3 by reading the plurality of first segments S1 and obtains the fourth data D4 by reading the second segment S2 (step S320). Thereafter, the data converting circuit 123 converts the fourth data D4 to the fifth data D5 (step S330). Accordingly, the decoding circuit 124 is capable of inspecting the memory array 130 according to the third data D3 and the fifth data D5 (step S340), for example, including finding out abnormal memory cells in the plurality of first segments S1 and the second segment S2, or determining the error bits in the third data D3 and the fifth data D5.

In some conditions, there are requirements for returning the read data to the host system, so that the data correcting circuit 125 may correct the third data D3 according to the third data D3 and the error bits thereof and then output the corrected third data D3' to the host system through the host interface 110.

Based on the above, the memory storage device and the memory testing method thereof provided by the embodiments of the disclosure can write the first data and the second data respectively into the plurality of first segments and the second segment of the memory array in a manner that the data contents are controllable, read the data respectively from the plurality of first segments and the second segment and convert the data read from the second segment to the check data which is obtained after the first data is encoded by using the encoding circuit corresponding to the decoding circuit. Thereafter, the memory array can be inspected by using the decoding circuit in the memory storage device. Accordingly, in a condition that the memory storage device keeps the error correction function, a preferable test coverage can be maintained, and the testing time can be saved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory testing method, for testing a memory array of a memory storage device, the memory testing method comprising:
    writing first data into a plurality of first segments of the memory array, and writing second data into a second segment of the memory array;
    obtaining third data by reading the plurality of first segments, and obtaining fourth data by reading the second segment; and
    converting the fourth data to fifth data, wherein the fifth data is the same as check data obtained by encoding the first data by using an encoding circuit corresponding to a decoding circuit of the memory storage device.

2. The memory testing method as claimed in claim 1, further comprising:
    inspecting the memory array according to the third data and the fifth data.

3. The memory testing method as claimed in claim 1, further comprising:
    determining an error bit in the third data and the fifth data according to the third data and the fifth data by using the decoding circuit, wherein the encoding circuit is an error correction code encoder, and the decoding circuit is an error correction code decoder.

4. The memory testing method as claimed in claim 3, further comprising:
    correcting the third data according to the third data and the error bit; and
    outputting the corrected third data to a host system.

5. The memory testing method as claimed in claim 1, wherein the first data is composed of a plurality of the second data.

6. The memory testing method as claimed in claim 1, wherein the encoding circuit is a circuit which encodes arbitrary data in compliance with a preset type to obtain all-0 check data.

7. The memory testing method as claimed in claim 6, wherein the arbitrary data which is composed of a plurality of repeated data segments is in compliance with the preset type.

8. The memory testing method as claimed in claim 6, wherein the first data is in compliance with the preset type, and the step of converting the fourth data to the fifth data comprises:
    performing an exclusive or (XOR) operation on the fourth data and the second data to obtain the fifth data.

9. A memory storage device, comprising:
    a memory array, comprising a plurality of first segments and a second segment; and
    a memory controlling circuit, comprising:
        a data writing circuit coupled to the memory array and configured to write first data into the plurality of first segments and write second data into the second segment;
        a data reading circuit coupled to the memory array and configured to obtain third data by reading the plurality of first segments and obtain fourth data by reading the second segment;
        a decoding circuit coupled to the data reading circuit; and
        a data converting circuit coupled between the data reading circuit and the decoding circuit and configured to convert the fourth data to fifth data, wherein the fifth data is the same as check data obtained by encoding the first data by using an encoding circuit corresponding to the decoding circuit.

10. The memory storage device as claimed in claim 9, wherein the memory controlling circuit is configured to inspect the memory array according to the third data and the fifth data, and the decoding circuit is further configured to determine an error bit in the third data and the fifth data according to the third data and the fifth data, wherein the memory controlling circuit further comprises:

a data correcting circuit coupled to the data reading circuit and the decoding circuit and configured to correct the third data according to the third data and the error bit, wherein the memory storage device further comprises:
a host interface coupled to the memory controlling circuit and configured to output the corrected third data to a host system.

11. The memory storage device as claimed in claim 9, wherein the first data is composed of a plurality of the second data.

12. The memory storage device as claimed in claim 9, wherein the encoding circuit is a circuit which encodes arbitrary data in compliance with a preset type to obtain all-0 check data.

* * * * *